(12) United States Patent
Okanobu

(10) Patent No.: US 7,373,124 B2
(45) Date of Patent: May 13, 2008

(54) RECEIVER

(75) Inventor: Taiwa Okanobu, Tokyo (JP)

(73) Assignee: Sony Corporation (JP)

( * ) Notice: Subject to any disclaimer, the term of this patent is extended or adjusted under 35 U.S.C. 154(b) by 574 days.

(21) Appl. No.: 11/102,317

(22) Filed: Apr. 7, 2005

(65) Prior Publication Data
US 2005/0225679 A1    Oct. 13, 2005

(30) Foreign Application Priority Data
Apr. 12, 2004    (JP)    ............................ P2004-116498

(51) Int. Cl.
*H04B 17/00* (2006.01)
(52) U.S. Cl. .................................... 455/226.1; 455/302
(58) Field of Classification Search ............. 455/226.1, 455/226.2, 226.4, 285, 302
See application file for complete search history.

(56) References Cited
U.S. PATENT DOCUMENTS
2005/0221776 A1* 10/2005 Okanobu ................. 455/226.1
2006/0035612 A1* 2/2006 Miyagi et al. ........... 455/226.1

* cited by examiner

*Primary Examiner*—Lee Nguyen
(74) *Attorney, Agent, or Firm*—Lerner, David, Littenberg, Krumholz & Mentlik, LLP

(57) ABSTRACT

A receiver includes a tuning circuit for picking up a reception signal having a desired frequency, a local oscillator for forming an oscillation signal, a first mixer for frequency-converting the reception signal into an IF signal by using the oscillation signal, an IF filter for deriving the IF signal from an output signal of the first mixer, a signal forming circuit for forming an AC signal having a frequency equal to a frequency of the IF signal, a second mixer to be supplied with the AC signal and the oscillation signal, a deriving circuit for deriving a signal having a desired frequency or an image frequency from an output of the second mixer, and a detector for detecting a level of the IF signal, wherein a self test is performed by supplying the signal derived from the deriving circuit to the tuning circuit and checking a detection output level of the detector.

6 Claims, 4 Drawing Sheets

FIG.3

| N | SELFTEST MODE FOR AM RECEPTION | SELFTEST MODE FOR FM RECEPTION |
|---|---|---|
| 6 | 30kHz | 60kHz |
| 7 | 35kHz | 70kHz |
| 8 | 40kHz | 80kHz |
| ⋮ | ..... | ..... |
| 11 | 55kHz | 110kHz |
| ⋮ | ..... | ..... |
| 25 | 125kHz | 250kHz |
| ⋮ | ..... | ..... |
| 80 | 400kHz | 800kHz |

RECEIVER

CROSS REFERENCES TO RELATED APPLICATIONS

The present invention contains subject matter related to Japanese Patent Application JP 2004-116498 filed in the Japanese Patent Office on Apr. 12, 2004, the entire contents of which being incorporated herein by reference.

BACKGROUND OF THE INVENTION

1. Field of the Invention

The present invention relates to a receiver of a super-heterodyne system.

2. Description of Related Art

In a receiver of a super-heterodyne system, the reception characteristics such as a reception sensitivity and image interference characteristics are degraded if the rated frequency relation between a reception frequency, a local oscillation frequency and an intermediate frequency is shifted.

A test signal generator is therefore provided for checking and adjusting the reception sensitivity, the center frequencies of an antenna tuning circuit and an intermediate frequency filter, and the reception characteristics such as image interference characteristics. A receiver is known which has therein a test signal generator of this type to provide a self test function. As prior art documents, refer to, for example, Japanese Laid-open Patent Applications No. 2000-13336 and No. 2001 -119316.

SUMMARY OF THE INVENTION

The electric characteristics of a test signal is required to be more excellent than the reception characteristics of a receiver. Therefore, if a test signal generator is built in the receiver, the receiver cost increases. Even if a test signal generator is built in a receiver, the test signal generator is made simple to suppress the cost so that it can only set the test signal to a reception frequency, and there are items which cannot be checked and adjusted.

For example, if a reception circuit is fabricated in an IC (Integrated Circuit) and an intermediate frequency filter is made of an external ceramic filter or a SAW (Surface Acoustic Wave) filter, checking the filter is omitted because these filters have generally characteristics to be changed less with time. If an intermediate frequency filter together with a reception circuit is fabricated in IC, although a change in the characteristics with temperature and time is large, check is not performed.

Checking and adjusting the image interference characteristics requires a test signal having an image frequency. In a radio of the so-called low IF scheme among others a reception signal is frequency-converted into a pair of orthogonal intermediate frequency signals, and the image signal components are cancelled out by phase processing to improve the image interference characteristics. A necessity for a test signal having an image frequency is fairly high. However, many test signal generators of a simple type cannot form the test signal having the image frequency.

The present invention intends to solve the above-described problems.

A receiver of the present invention comprises a tuning circuit for picking up a reception signal having a desired frequency, a local oscillation circuit for forming a local oscillation signal, a first mixer circuit for frequency-converting the reception signal into an intermediate frequency signal by using the local oscillation signal, an intermediate frequency filter for deriving the intermediate frequency signal from an output signal of the first mixer circuit, a signal forming circuit for forming an AC signal having a frequency equal to an intermediate frequency of the intermediate frequency signal, a second mixer circuit to be supplied with the AC signal and the local oscillation signal, a deriving circuit for deriving a signal having a desired frequency or an image frequency from an output of the second mixer circuit, and a detection circuit for detecting a level of the intermediate frequency signal, wherein self test is performed by supplying the signal derived by the deriving circuit to the tuning circuit and checking a detection output of the detection circuit.

According to one embodiment of the present invention, selectivity characteristics of the receiver can be subjected to self test and stable reception is possible even if the intermediate frequency filter is fabricated to be in one chip monolithic IC. The image characteristics can also be tested, and self test is possible also for reception circuits of the low IF scheme and direct conversion scheme. Initial adjustment and test of the reception circuit can be performed by using the same system. Various characteristics can be checked or adjusted easily.

If the external antenna is connected during the self test, an alarm is issued and the test signal is not formed. The test signal will not be irradiated inadvertently as radio waves from the external antenna. It is also possible to avoid influence and interference upon the self test due to a reception signal of broadcasting waves.

BRIEF DESCRIPTION OF THE DRAWINGS

FIG. 3 is a table showing test modes of AM reception and FM reception; and

DESCRIPTION OF THE PREFERRED EMBODIMENTS

[1] Reception Circuit 10

Figure 1:
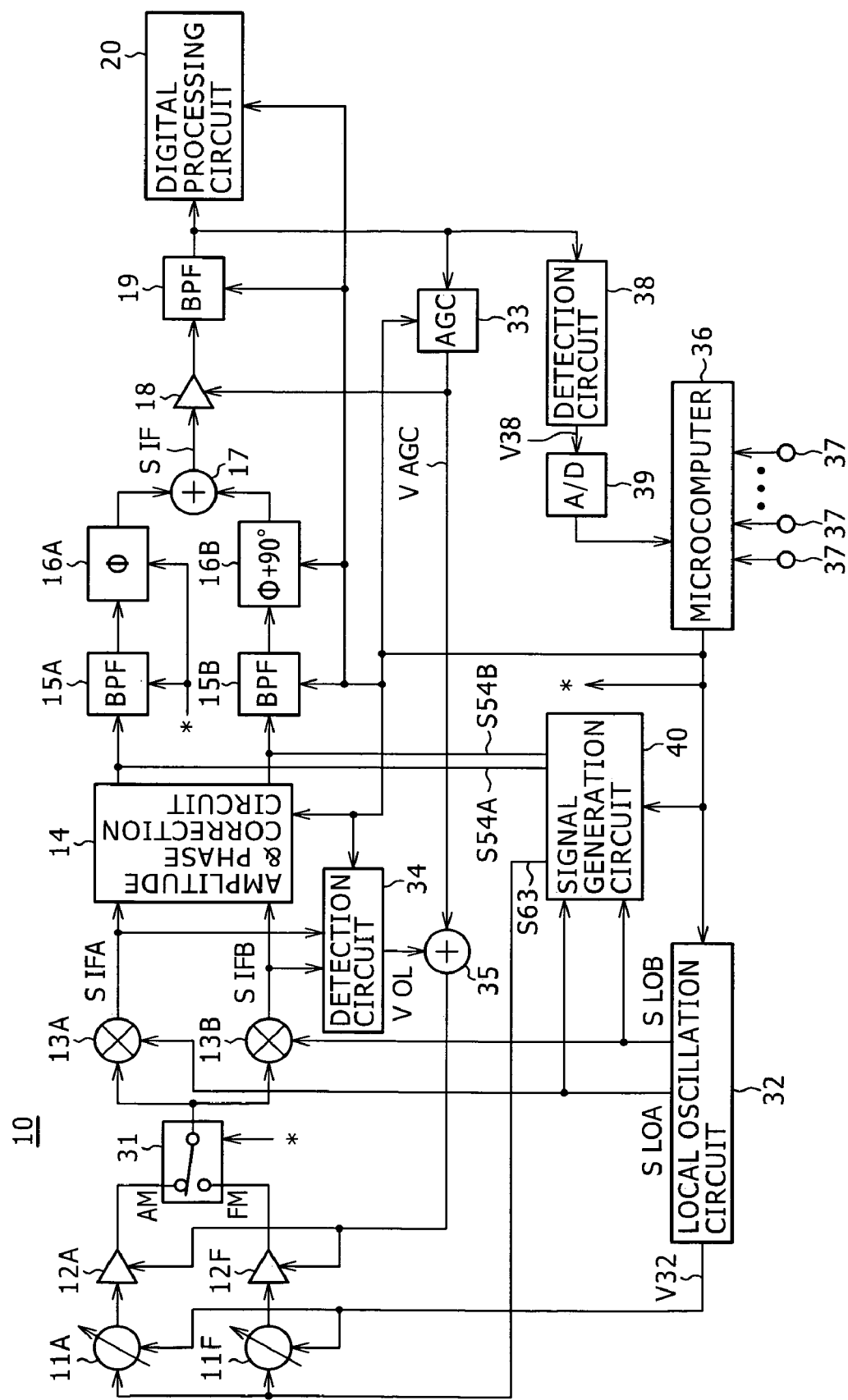
FIG. 1 is a block diagram of a receiver according to an embodiment of the invention.

FIG. 1 is a block diagram showing an example of a reception circuit 10 of a receiver for AM broadcasting (middle wave broadcasting) and FM broadcasting to which the present invention is applied. This reception circuit 10 is of a so-called low IF scheme in which an intermediate frequency is set to be much lower frequency than a reception frequency by setting a local oscillation frequency near to the reception frequency. A reception signal is frequency-converted into a pair of orthogonal intermediate frequency signals, and the image characteristics are improved by phase processing.

Namely, during AM broadcasting reception, a reception signal SRX having a desired frequency (target reception frequency) fRX is picked up from an antenna tuning circuit 11A of an electronic tuning type, and this reception signal SRX is supplied to a pair of mixer circuits 13A and 13B via a high frequency amplifier 12A and a band switching circuit 31.

During FM broadcasting reception, a reception signal SRX having a desired frequency fRX is picked up from an antenna tuning circuit 11F of an electronic tuning type, and this reception signal SRX is supplied to the pair of mixer circuits 13A and 13B via a high frequency amplifier 12F and the band switching circuit 31.

A local oscillation circuit 32 is constituted of a PLL circuit which generates two signals SLOA and SLOB having phases different by 90° and a frequency near to the frequency fRX of the reception signal SRX. The signals SLOA and SLOB are supplied as local oscillation signals to the mixer circuits 13A and 13B, respectively. For example, a frequency fLO of the local oscillation signals SLOA and SLOB is set to a frequency higher than the reception frequency fRX by 55 kHz during AM broadcasting reception, and to a frequency lower than the reception frequency by 250 kHz during FM broadcasting reception.

The mixer circuits 13A and 13B frequency-divide the reception signal SRX of AM broadcasting or FM broadcasting into a pair of intermediate frequency signals SIFA and SIFB by using the local oscillation signals SLOA and SLOB, respectively. In this case, each of the intermediate frequency signals SIFA and SIFB contains signal components of a desired frequency and signal components of an image frequency. For the purposes of simplicity, in the following description, the signal components of a desired frequency are called as the intermediate frequency signals SIFA and SIFB, and the signal components of the image frequency are called as the image signal components.

In the examples of the above-described local oscillation frequencies, the intermediate frequency fIF for AM reception is 55 Khz and the intermediate frequency fIF for FM reception is 250 kHz. Since the local oscillation signals SLOA and SLOB have a phase difference of 90° to each other, the intermediate frequency signals SIFA and SIFB are orthogonal at a phase difference of 90°, and the image signal components are orthogonal at a phase difference of 90° in the opposite relation to the intermediate frequency signals SIFA and SIFB.

A portion of a control voltage V32 to be applied to a variable capacitance diode of a VCO (not shown) of the PLL circuit is derived from the PLL circuit constituting the local oscillation circuit 32, and this control voltage V32 is supplied as a tuning voltage to the tuning circuits 11A and 11F to tune in the reception signal SRX.

The intermediate frequency signals SIFA and SIFB (and image components) from the mixer circuits 13A and 13B are supplied to an amplitude phase correction circuit 14 which corrects a relative amplitude error and phase error of the intermediate frequency signals SIFA and SIFB. The error-corrected intermediate frequency signals SIFA and SIFB are supplied to phase shift circuits 16A and 16B via band-pass filters 15A and 15B constituting intermediate frequency filters. The phase shift circuits shift the phases, for example, in such a manner that the intermediate frequency signals SIFA and SIFB have the same phase and the image signal components have opposite phases.

The intermediate frequency signals SIFA and SIFB after phase shift are supplied to an calculation circuit 17 and added together. An intermediate frequency signal SIF canceling out the image components is outputted from the calculation circuit 17. The intermediate frequency signal SIF is supplied via an intermediate frequency amplifier 18 and a band-pass filter 19 to a digital processing circuit 20 which A/D converts the intermediate frequency signal and executes a predetermined digital process corresponding to the format of the reception signal SRX to output an audio signal.

The amplifiers 12A, 12F and 18 are made of variable gain amplifiers. A portion of the intermediate frequency signal SIF from the band-pass filter 19 is supplied to an AGC voltage forming circuit 33 which forms an AGC voltage VAGC. The AGC voltage VAGC is supplied to the amplifier 18 as a gain control signal to conduct AGC at the intermediate frequency stage. The AGC voltage VAGC is also supplied via an addition circuit 35 to the high frequency amplifiers 12A and 12F as a gain control signal to conduct AGC at the high frequency stage.

The intermediate frequency signals SIFA and SIFB outputted from the mixer circuits 13A and 13B are also supplied to an excessive input detection circuit 34 which generates an AGC voltage VOL when a reception level becomes too high. This AGC voltage VOL is supplied via the addition circuit 35 to the high frequency amplifiers 12A and 12F as a gain control signal to conduct delayed AGC at the high frequency stage. The receiver is provided with a test signal generation circuit 40 for self test to be described later. The above-described reception circuit 10 and test signal generation circuit 40 are fabricated in one chip monolithic IC, excepting the tuning circuits 11A and 11F and a resonance circuit in the local oscillation circuit 32 and the digital processing circuit 20. The digital processing circuit 10 is also fabricated in one chip IC.

A microcomputer 36 is provided as a system control circuit. Operation switches 37 such as a tuning switch is connected to the microcomputer 36. A portion of the intermediate frequency signal SIF outputted from the band-pass filter 19 is supplied to a peak value detection circuit 38 which detects a voltage representative of the peak value of the intermediate frequency signal SIF. This voltage V38 is supplied to an A/D converter circuit 39, A/D converted and supplied to the microcomputer 36.

With the structure described above, for example, when a power is turned on, the microcomputer 36 supplies a correction control signal to the correction circuit 14 which is controlled, as described earlier, in such a manner that the image signal components contained in the intermediate frequency signals SIFA and SIFB are made to have the same amplitude and opposite phases so that the calculation circuit 17 can cancel out the image signal components.

As a band switch of the operation switches 37 is operated, the microcomputer 36 supplies a control signal to the switching circuit 31 which takes a state shown in FIG. 1 or an opposite state to enter a reception mode of AM broadcasting or FM broadcasting. At this time, the microcomputer 36 supplies a signal representative of the reception mode to the circuits 15A, 15B, 16A, 16B, 19, 20 and 32 to change the characteristics of these circuits for reception of AM broadcasting or FM broadcasting.

As the tuning switch of the operation switches 37 is operated, the microcomputer 36 supplies a predetermined control signal to the local oscillation circuit 32 to change the oscillation frequency of the local oscillation signals SLOA and SLOB, and to change the reception frequency fRX to a desired frequency. AM and FM broadcasting at an arbitrary frequency can therefore be received. Furthermore, AGC is conducted by the AGC control voltages VAGC and VOL.

[2] Test Signal Generation Circuit 40

[2-1] Structure of Test Signal Generation Circuit 40

Figure 2:
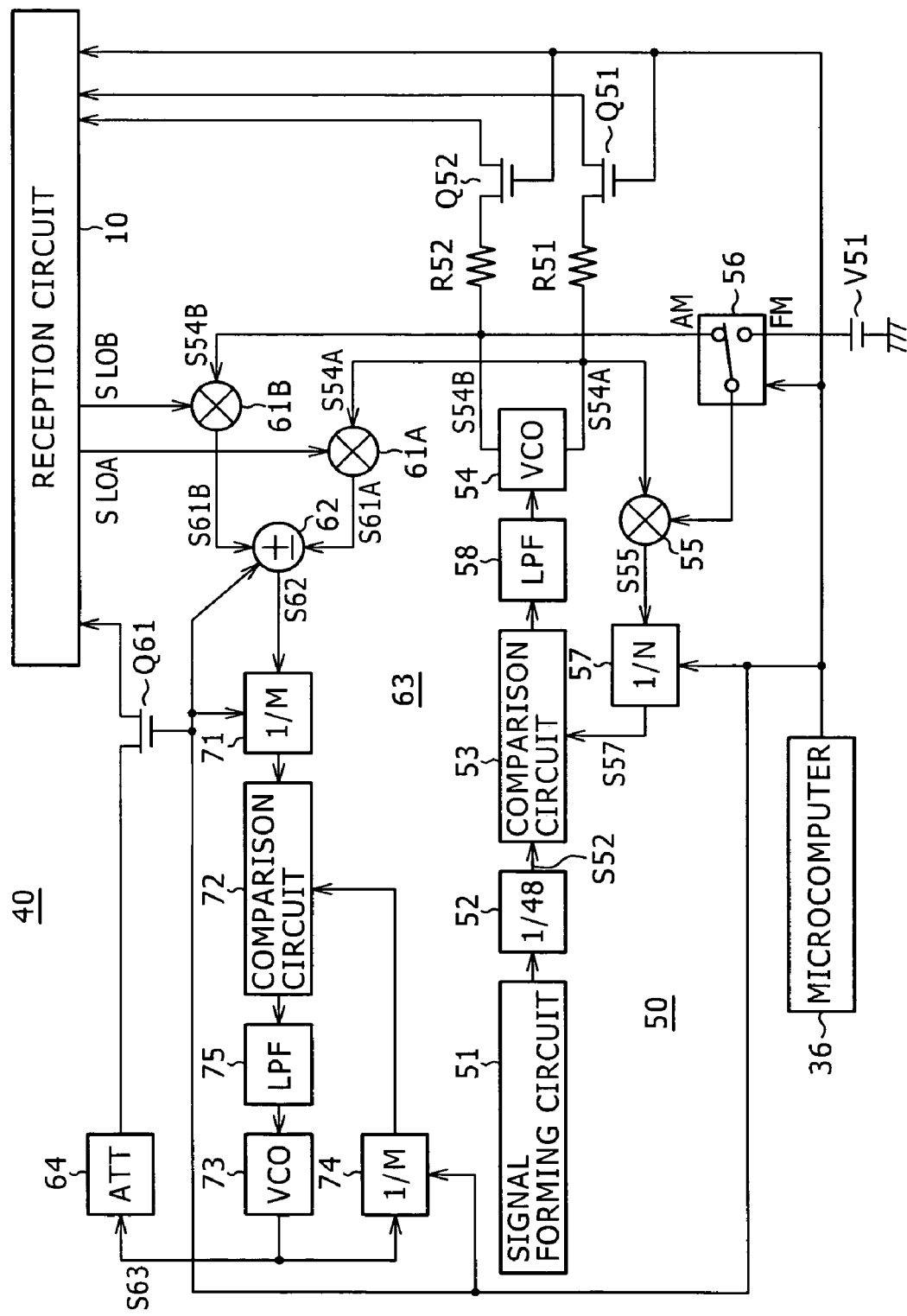
FIG. 2 is a block diagram of a test signal generation circuit according to an embodiment of the present invention.

In the present invention, the receiver has the built-in test signal generation circuit 40 which is structured, for example, as shown in FIG. 2. The test signal generation circuit 40 is provided with an AM reception self test mode and an FM reception self test mode.

The test signal generation circuit 40 has a PLL circuit 50 which outputs an AC signal having the intermediate frequency fIF. Namely, a signal forming circuit 51 is made of, for example, a crystal oscillation circuit. The signal forming circuit outputs an AC signal having a predetermined stable frequency, e.g., 480 kHz, to a frequency dividing circuit 52 which frequency-divides it into a signal S52 having a frequency of, e.g., 10 kHz. This signal S52 is supplied to a phase comparison circuit 53 as its reference signal.

A VCO 54 is also provided which outputs a pair of oscillation signals S54A and S54B having a predetermined frequency and different phases shifted by 90°. In this case, although it will become apparent later, in the normal state, the frequency of the oscillation signals S54A and S54B is equal to the intermediate frequency fIF (=55 kHz or 250 kHz) in the reception circuit 10. If the local oscillation signals SLOA and SLOB in the reception circuit 10 are given by:

$$SLOA = \sin(2\pi \times fLO \times t) \quad (1A)$$

$$SLOB = \cos(2\pi \times fLO \times t) \quad (1B)$$

then the oscillation signals S54A and S54B have the following phase relation:

$$S54A = \cos(2\pi \times fIF \times t) \quad (2A)$$

$$S54B = \sin(2\pi \times fIF \times t) \quad (2B)$$

The oscillation signal S54A is supplied to a multiplier circuit 55, and the oscillation signal S54B is supplied to a switching circuit 56. A DC voltage V51 equal to the DC level of the signals S54A and S54B is also applied to the switching circuit 56. The microcomputer 36 makes the switching circuit 56 have a connection state shown in FIG. 2 in the AM reception self test mode, and an opposite state in the FM reception test mode, and an output from the switching circuit is supplied to a multiplier circuit 55.

In the AM reception self test mode, since the oscillation signals S54A and S54B are supplied to the multiplier circuit 55, the multiplier circuit 55 outputs a signal S55 having a frequency of 2×fIF of the oscillation signals S54A and S54B. In the FM reception self test mode, since the oscillation signal S54A and the DC voltage V51 are supplied to the multiplier circuit 55, the multiplier circuit outputs a signal S55 having the frequency fIF of the oscillation signal S54A.

This signal S55 is supplied to a variable frequency dividing circuit 57 which frequency-divides it into a frequency-divided signal S57 having a 1/N frequency. This signal S57 is supplied to the phase comparison circuit 53. A frequency division ratio N is set by the microcomputer 36 as in the following:

N=11 . . . in AM reception self test mode

N=25 . . . in FM reception self test mode

By using the frequency of the frequency-divided signal S52 as a reference, the phase comparison circuit 53 compares the phase of the signal S57 with that of the signal S52, and a comparison output is supplied to a low-pass filer 58 which outputs a DC voltage having a level corresponding to the phase difference between the signals S57 and S52. This voltage is supplied to VCO 54 as its control signal.

During the normal operation, since the frequency-divided signals S52 and S57 applied to the phase comparison circuit 53 have the same frequency and f52=f54×2/N in the AM reception self test mode, f54 is given by:

$$f54 = f52 \times N/2$$

$$= 10 \text{ kHz} \times 11/2$$

$$= 55 \text{ kHz}$$

$$= \text{intermediate frequency } fIF \text{ in } AM$$

broadcasting reception mode, where:

f52: frequency of frequency-divided signal S52=10 kHz
f54: oscillation frequency of VCO 54.
In the FM reception self test mode, since f52=f54/N;

$$f54 = f52 \times N$$

$$= 10 \text{ kHz} \times 25$$

$$= 250 \text{ kHz}$$

$$= \text{intermediate frequency } fIF \text{ in } FM$$

broadcasting reception mode.

Namely, the frequency of the oscillation signals S54A and S54B of VCO 54 becomes, in the AM reception self test mode, equal to the intermediate frequency fIF in the AM broadcasting reception mode, and in the FM reception self test mode, equal to the intermediate frequency fIF in the FM reception self test mode.

The oscillation signals S54A and S54B are supplied to mixer circuits 61A and 61B, and the local oscillation signals SLOA and SLOB outputted from the local oscillation circuits 32 of the reception circuit 10 are also supplied to the mixer circuits 61A and 61B. The output signals S61A and S61B from the mixer circuits 61A and 61B are supplied to a calculation circuit 62.

In this case, the frequencies and phases of the local oscillation signals SLOA and SLOB are given by the equations (1A) and (1B) and the frequencies and phases of the oscillation signals S54A and S54B are given by the equations (2A) and (2B). Therefore, the following equations are established:

$$2 \times S61A = 2 \times SLOA \times S54A \quad (3A)$$
$$= \sin(2\pi \times (fLO + fIF) \times t) +$$
$$\sin(2\pi \times (fLO - fIF) \times t)$$

$$2 \times S61B = 2 \times SLOB \times S54B \quad (3B)$$
$$= \sin(2\pi \times (fLO + fIF) \times t) -$$
$$\sin(2\pi \times (fLO - fIF) \times t)$$

When the signal S61A is added to the signal S61B by the calculation circuit 62, its output signal S62 can be expressed from the equations (3A) and (3B) as:

$$2 \times S62 = s \times (S61A + S61B) \quad (4)$$
$$= \sin(2\pi \times (fLO + fIF) \times t)$$

When the signal S61B is subtracted from the signal S61A by the calculation circuit 62, its output signal S62 can be expressed as:

$$2 \times S62 = s \times (S61A - S61B) \qquad (5)$$
$$= \sin(2\pi \times (fLO - fIF) \times t)$$

The signal S62 shown in the equation (4) is the image frequency fIMG in the AM broadcasting reception mode or the reception frequency fRX (desired frequency) in the FM broadcasting reception mode.

The signal S62 shown in the equation (5) is the reception frequency fRX (desired frequency) in the AM broadcasting reception mode or the image frequency fIMG in the FM broadcasting reception mode.

The microcomputer 36 supplies the calculation circuit 62 with a control signal indicative of addition or subtraction so that the signal S62 shown in the equation (4) or (5) is outputted from the calculation circuit 62. This output signal S62 is supplied to a PLL filter 63 which outputs a highly pure signal S63 with unnecessary components being eliminated.

Namely, the output signal S62 from the calculation circuit 62 is supplied to a variable frequency dividing circuit 71 which frequency-divides it into a frequency-divided signal having a 1/M frequency. The frequency-divided signal is supplied to a phase comparison circuit 72. The microcomputer 36 sets the frequency division ratio M to M=1 in the AM reception self test mode, and to M=8 in the FM reception self test mode.

A comparison output of the phase comparison circuit 72 is supplied via a low-pass filter 75 to VCO 73 as its control signal. Therefore, the frequency of an oscillation signal of VCO 73 becomes equal to the frequency of the output signal S62. The oscillation signal has a higher purity than that of the signal S62. The signal S62 is therefore changed to a highly pure test signal S63 by the PLL filter 63.

This test signal S63 is supplied to an attenuator circuit 64 to make it have a predetermined level. The source-drain path of an FET Q61 as a switching circuit is connected between an output terminal of the attenuator circuit 64 and the antenna tuning circuits 11A and 11F of the reception circuit 10. The microcomputer 36 applies a predetermined control signal to the gate of FET Q61.

The oscillation signals S54A and S54B from VCO 54 are applied to one ends of level adjusting resistors R51 and R52. The source-drain paths of an FET Q51 and an FET Q52 as a switching circuit are connected between other ends of the resistors R51 and R52 and the input terminals of the band-pass filters 15A and 15B of the reception circuit 10, respectively. The microcomputer 36 applies predetermined control signals to the gates of FETs Q51 and Q52.

This test signal generation circuit 40 is fabricated in one chip IC together with the reception circuit 10 excepting some circuits as described earlier.

[2-2] Operation and Use Method of Test Signal Generation Circuit 40

The following operations and processes are performed when the reception characteristics of the reception circuit 10 are checked and adjusted by using the test signal generation circuit 40.

[2-2-1] Check and Adjustment of AM Reception Sensitivity and the Like

In this case, the operation switches 37 are operated to set the reception circuit 10 to the AM broadcasting reception mode, and the test signal generation circuit 40 to the AM reception self test mode.

The microcomputer 36 supplies control signals to set the calculation circuit 62 to a subtraction mode and to turn FET Q61 on and FETs Q51 and Q52 off. Further, the microcomputer 36 supplies control signals to control the AGC voltage forming circuit 33 and the excessive input detection circuit 34 to make the AGC voltages VAGC and VOL have a rated constant level and fix the gains of the amplifiers 12A and 18 to predetermined gains.

The calculation circuit 62 therefore outputs the subtraction signal S62 shown in the above-described equation (5). This signal S62 is changed to the test signal S63 by the PLL filter 63. This test signal S63 is supplied via the attenuator circuit 64 and FET Q61 to the antenna tuning circuit 11A of the reception circuit 10. In this case, the voltage V38 indicates the level of the intermediate frequency signal SIF.

It is therefore possible for the microcomputer 36 to know the gains and sensitivities of the high frequency stage and intermediate frequency stage. It is also possible to check and adjust the center frequency of the antenna tuning circuit 11A. The frequency of the test signal S63 can be changed to an arbitrary frequency at the frequency step of AM broadcasting, because the microcomputer 36 changes the local oscillation frequency fLO of the local oscillation circuit 32.

[2-2-2] Check and Adjustment of AM Reception Image Interference Characteristics

In this case, in the state of [2-2-1], the process of the calculation circuit 62 is changed to an addition mode. The calculation circuit 62 therefore outputs the addition signal S62 shown in the above-described equation (4). This signal S62 is changed to the test signal S63 which is supplied to the antenna tuning circuit 11A of the reception circuit 10. It is therefore possible to check the image interference characteristics.

[2-2-3] Check and Adjustment of AM Reception Intermediate Frequency

In this case, in the state of [2-2-1], the microcomputer 36 supplies control signals to turn FET Q61 off and FETs Q51 and Q52 on. The oscillation signals S54A and S54B of VCO 54 are therefore supplied via FET2 Q51 and Q52 to the band-pass filters 15A and 15B of the reception circuit 10 as test signals.

In this case, the frequency f54 of the oscillation signals S54A and S54B is equal to a normal intermediate frequency fIF in the AM reception mode. The microcomputer 36 changes the frequency division ratio N of the variable frequency dividing circuit 57, e.g., incrementing by 1 in the range of N=3 to 80, so that the frequency f54 of the oscillation signals S54A and S54B can be changed at a step of 5 kHz as shown in FIG. 3.

It is therefore possible to check and adjust the intermediate frequencies, i.e., the center frequencies of the intermediate frequency filters 15A, 15B and 19.

[2-2-4] Check and Adjustment of FM Reception

In this case, the operation switches 37 are operated to set the reception circuit 10 to the FM broadcasting reception mode, and the test signal generation circuit 40 to the FM reception self test mode.

The microcomputer 36 supplies control signals to set the calculation circuit 62 to an addition or subtraction mode and to turn FET Q61 on and FETs Q51 and Q52 off, or conversely to turn FET Q61 off and FETs Q51 and Q52 on. Under these conditions, similar to the above-described AM reception check and adjustment, it is possible to check and adjust the FM reception characteristics and the image interference characteristics.

During the intermediate frequency check and adjustment, the frequency f54 of the oscillation signals S54A and S54B can be changed at a step of 100 kHz as shown in FIG. 3.

[3] Input Circuit for Reception Signal and Test Signal

[3-1] Structure of Input Circuit for Test Signal S63

Figure 4:
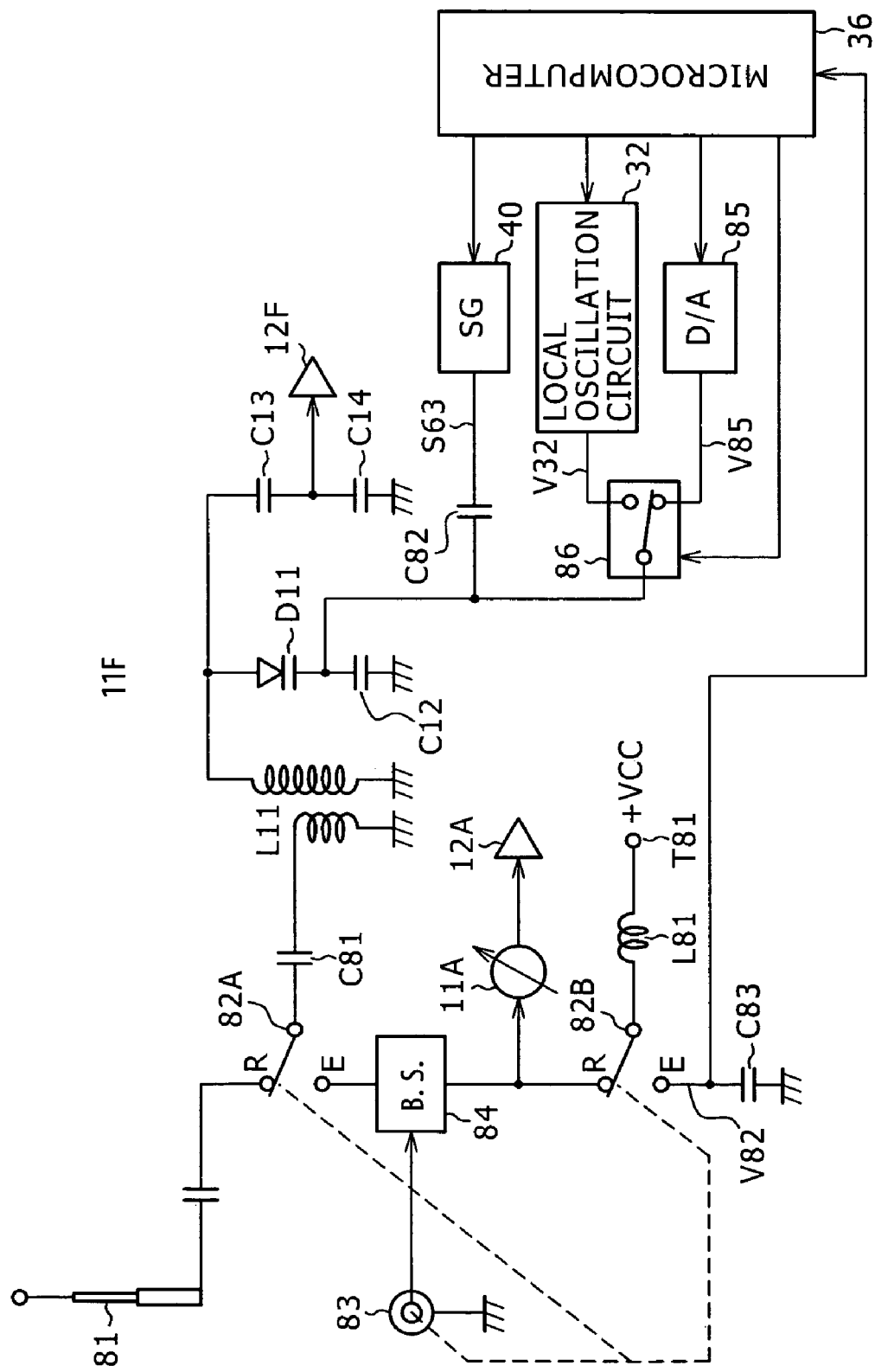
FIG. 4 is a block diagram illustrating how a test signal is supplied to an antenna tuning circuit.

FIG. 4 shows a specific example of the structure of an input circuit for supplying the test signal S63 to the antenna tuning circuit 11F for FM reception. In this example, the receiver is equipped with a so-called rod antenna for FM reception and an external antenna can be used for AM and FM reception.

A rod antenna 81 is connected to an internal antenna side contact R of an antenna switch 82A, and an external antenna jack 83 is connected via a band splitter (distributor) 84 to an external antenna side contact E of the switch 82A, to an internal antenna side contact R of an antenna switch 82B, and to the antenna tuning circuit 11A.

The switches 82A and 82B interoperate mechanically with the jack 83, while an antenna plug (not shown) connected to an external antenna is not inserted into the jack 83, the switches are connected to the contacts R, and while it is inserted, the switches are connected to the contacts E.

A parent contact of the switch 82A is connected via a capacitor C81 to an input winding of an antenna coil L11 constituting the antenna tuning circuit 11F, and an output winding thereof is connected in parallel to a serial circuit of a variable capacitance diode D11 and a capacitor C12. An output signal of the tuning circuit 11F is picked up from capacitors C13 and C14 and supplied to the high frequency amplifier 12F. The tuning coil of the antenna tuning circuit 11A is a so-called bar antenna whose windings are wound around a ferrite core.

In operation of the test signal generation circuit 40 described in [2-2], the microcomputer 36 supplies predetermined control signals to the test signal generation circuit 40 which in turn generates the test signal S63. The test signal S63 is supplied via a capacitor C82 to the variable capacitance diode D11.

The microcomputer 36 supplies data for setting the tuning frequency of the antenna tuning circuit 11F, to a D/A converter circuit 85 which in turn supplies an analog voltage V85 to a switching circuit 86. A control voltage V32 is also supplied to the switching circuit 86 from the local oscillation circuit 32. The microcomputer 36 supplies a control signal to the switching circuit 86, and an output from the switching circuit 86 is supplied to the variable capacitance diode D11 as its control voltage.

A power source terminal T81 is connected via a high frequency choke coil L81 to the parent contact of the switch 82B whose external antenna side contact E is connected to a bypass capacitor C83, and a voltage V82 at the contact E is applied to the microcomputer 36.

[3-2] Reception of Broadcasting

AM and FM broadcasting reception is predefined in the following manner depending upon connection and non-connection of the external antenna. During broadcasting reception, the switching circuit 86 is connected to the local oscillation circuit 32.

[3-2-1] Non-Connection of External Antenna

In this case, the switches 82A and 82B are connected to the contacts R. During FM broadcasting reception, FM broadcasting waves are received at the rod antenna 81 and the reception signal SRX is supplied via the switch 82A to the antenna tuning circuit 11F. Also in this case, the control voltage V32 from the local oscillation circuit 32 is supplied via the switching circuit 86 to the variable capacitance diode D11. FM broadcasting at a desired frequency can therefore be listened to.

During AM broadcasting reception, the bar antenna constituting the antenna tuning circuit 11A receives AM broadcasting waves and tuning is performed by the antenna tuning circuit 11A in accordance with the control voltage V32 from the local oscillation circuit 32. AM broadcasting at a desired frequency can therefore be listened to.

[3-2-2] Connection of External Antenna

In this case, the switches 82A and 82B are connected to the contacts E. During FM broadcasting reception, a reception signal SRX of FM broadcasting received at the external antenna is supplied to the antenna tuning circuit 11F via a signal path from the jack 83 to the splitter 84 and to the switch 82A. FM broadcasting at a desired frequency can therefore be listen to.

During AM broadcasting reception; a reception signal SRX of AM broadcasting received at the external antenna is supplied to the antenna tuning circuit 11A via the jack 83 and the splitter 84. AM broadcasting at a desired frequency can therefore be listen to.

In the case of [3-2-2], a power supply voltage+VCC at a power source terminal T81 is outputted to the jack 83 via a signal line from the high frequency choke coil L81 to the switch 82B and to the splitter 84. By using this voltage applied to the jack, an active antenna can be used as the external antenna.

[3-3] Check and Adjustment of Test Signal S63

In this case, the external antenna is not connected to the jack 83 to make the switches 82A and 82B contact the contacts R. As described in [2-2], the microcomputer 36 sets the receiver to enter the self test mode of FM broadcasting reception. The switch circuit 86 is connected to the D/A converter circuit 85. The rod antenna 81 is compressed so as not to receive FM broadcasting waves.

The microcomputer 36 controls the test signal generation circuit 40 to generate the test signal S63 which is supplied to the antenna tuning circuit 11F. The frequency of the test signal S63 can be changed by changing the frequency division ratio N of the variable frequency dividing circuit 57, while the local oscillation frequency fLO is fixed. The control voltage V85 from the D/A converter circuit 85 is supplied via the switching circuit 86 to the variable capacitance diode D11.

Since the tuning frequency of the antenna tuning circuit 11F, the local oscillation frequency fLO and the frequency of the test signal S63 can be changed independently, it is possible to check and adjust the following items by using the test signal generation circuit 40.

[3-3-1] Items Capable of Being Checked and Adjusted (1) The voltage V38 (refer to FIG. 1) representative of the level of the intermediate frequency signal SIF is checked by setting the AGC voltages VAGC and VOL to constant values to fix the amplifiers 12A, 12F and 19 to the maximum gains. The maximum gain or sensitivity of the reception system can therefore be measured.

(2) The AGC voltages VAGC and VOL are sequentially changed to check the voltage V38 at each AGC voltage. It is therefore possible to check or confirm the operation of AGC.

(3) Under the state that the tuning frequencies of the tuning circuits 11A and 11F are fixed to correct values, the oscillation frequency f54 of the oscillation signals S54A and S54B is changed by changing the frequency division ratio N of the frequency dividing circuit 57 shown in FIG. 2. Since the intermediate frequency signal SIF can be obtained at the detuned frequency from the reception frequency fRX, it is possible to check from the voltage V38 the attenuation characteristics of the band-pass filter 18 and the like.

(4) The test signal S63 is supplied to the tuning circuit 11F, and the tuning frequency of the tuning circuit 11F is changed under the condition that the local oscillation frequency fLO is fixed. It is possible to check the tuning characteristics of the tuning circuit 11F by checking the voltage V38.

(5) The frequency of the test signal S63 is set to the image frequency by making the calculation circuit 62 (refer to FIG. 2) execute addition or subtraction. The image signal level can be made minimum by controlling the amplitude phase correction circuit 14 (refer to FIG. 1) in such a manner that the voltage V38 becomes minimum.

(6) Control data for the amplitude phase correction circuit 14 in the above operation (5) is stored in the microcomputer 36, and when a power is turned on, the amplitude phase correction circuit 14 is controlled by using the stored control data. In this manner, it becomes possible to omit the process of checking the image interference characteristics and setting the amplitude phase correction circuit 14.

[3-3-2] Supplement

If the switch 82A is connected to the contact E as opposed to the state shown in FIG. 4, check and adjustment in [3-3] cannot be performed correctly by supplying the test signal S63 to the tuning circuit 11F, because a signal received at the external antenna is supplied to the tuning circuit 11F.

Furthermore, the test signal S63 supplied to the tuning circuit 11F is leaked to the external antenna via the signal path from the tuning circuit 11F to the switch 82A, to the splitter 84 and to the jack 83.

In the input circuit shown in FIG. 4, as the external antenna is connected to the jack 83, the switch 82B is connected to the contact E so that the voltage V82 at the contact E is the power supply voltage of +VCC, whereas as the external antenna is not connected to the jack 83, the switch 82B is connected to the contact R so that the voltage V82 takes a ground potential. Namely, the voltage V82 is a detection voltage indicating whether the external antenna is connected or not.

The microcomputer 36 discriminates this voltage V82, and if the voltage V82=+VCC, i.e., while the external antenna is connected to the jack 83, transition to the self test mode is invalidated and an alarm indicating a connection of the external antenna is displayed on a display unit (not shown) such as an LCD and an LED connected to the microcomputer 36.

If the external antenna is not connected to the jack 83, the switch 82A is connected to the rod antenna 81 as shown in FIG. 4 (and in addition, the rod antennal 81 is compressed) and FM broadcasting waves will not be received and supplied to the antenna tuning circuit 11F. It is therefore possible to correctly check and adjust by using the test signal S63.

In this case, the test signal S63 supplied to the tuning circuit 11F will not be leaked from the tuning circuit to the external antenna via the switch 82A.

Although the description is omitted, the structure similar to that described above is applicable to the AM reception system.

[4] Summary

With the above-described reception circuit 10 and test signal generation circuit 40, selectivity characteristics of the reception circuit can be subjected to self test and stable reception is possible even if the intermediate frequency filter is fabricated in a monolithic IC. The image characteristics can also be tested, and self test is possible also for reception circuits of the low IF scheme and direct conversion scheme.

Since the test signal generation circuit 40 forms the test signal S63 from the local oscillation signals SLOA and SLOB used by the reception circuit 10 and the signals S54A and S54B having the intermediate frequency fIF formed by the PLL circuit 50, initial adjustment and test of the reception circuit can be performed by using the same system. Since the tuning frequency of the antenna tuning circuit 11F, the local oscillation frequency fLO and the frequency of the test signal. S63 can be changed or set independently, various characteristics can be checked or adjusted easily.

If the external antenna is connected during the self test, an alarm is issued and the test signal S63 is not formed. The test signal S63 will not be irradiated inadvertently as radio waves from the external antenna. It is also possible to avoid influence and interference upon the self test due to a reception signal of broadcasting waves. Since the test signal generation circuit 40 is built in the receiver, it is not necessary to prepare a new test signal generator to check the reception characteristics, and the optimum state of the receiver can be retained.

The output signal S62 from the calculation circuit 62 may be supplied as the test signal to the antenna tuning circuits 11A and 11F via the attenuator circuit 64. If a poly-phase filter is used, extraction and phase shift of the intermediate frequency signal can be realized at the same time. The band-pass filer 15A and phase shift circuit 16A may be constituted of a first poly-phase filter and the band-pass filer 15B and phase shift circuit 16B may be constituted of a second poly-phase filter.

For reception of short wave broadcasting and long wave broadcasting, antenna tuning circuits and high frequency amplifiers for the short and long wave broadcasting are provided similar to the antenna tuning circuits 11A and 11F and high frequency amplifiers 12A and 12F, and the reception signal is supplied via the bandswitch circuit 31 to the mixer circuits 13A and 13B.

Although the switches 82A and 82B are operated by mechanically detecting an event that the external antenna is connected to the jack 83, if an active antenna is used, current consumed by the active antenna is detected, and switching circuits corresponding to the switches 82A and 82B are operated in accordance with a detected signal.

What is claimed is:

1. A receiver comprising:
   a tuning circuit for picking up a reception signal having a predetermined frequency;
   a local oscillation circuit for forming a local oscillation signal;
   a first mixer circuit for frequency-converting the reception signal into an intermediate frequency signal by using the local oscillation signal;
   an intermediate frequency filter for deriving the intermediate frequency signal from an output signal of the first mixer circuit;
   a signal forming circuit for forming an AC signal having a frequency equal to an intermediate frequency of the intermediate frequency signal;
   a second mixer circuit supplied with the AC signal and the local oscillation signal;
   a deriving circuit for deriving a signal having a predetermined frequency or an image frequency from an output of the second mixer circuit; and
   a detection circuit for detecting a level of the intermediate frequency signal, wherein a self test is performed by supplying the signal derived from the deriving circuit to the tuning circuit and checking a detection output level of the detection circuit.

2. The receiver as cited in claim 1, further comprising:
a variable gain amplifier for amplifying the intermediate frequency signal, and
an AGC voltage forming circuit for forming an AGC voltage out of the intermediate frequency signal amplified by the variable gain amplifier, wherein
an AGC is performed by supplying the AGC voltage to the variable gain amplifier as a reference when receiving the reception signal, and
the AGC voltage is fixed to be a predetermined value when performing the self test.

3. The receiver as cited in claim 2, wherein
selectivity characteristics of the receiver are checked by changing a frequency of the AC signal or a frequency of a signal derived from the deriving circuit in a state where a local oscillation frequency of the local oscillation signal is fixed.

4. The receiver as cited in claim 2, or 3, wherein
the detection output of the detection circuit is A/D converted into a digital signal, and the digital signal is taken into a micro-computer for executing processing thereon.

5. The receiver as cited in claim 2, or 3, further comprising:
an external antenna terminal; and
warning means, wherein
a warning that an external antenna is connected to the external antenna terminal is performed by the warning means, and the self test is not started in a case when an external antenna is connected to the external antenna terminal.

6. The receiver as cited in claim 2 or 3, wherein
a whole circuit except the tuning circuit and a resonance circuit is fabricated to be in a form of one chip IC.

* * * * *